US012652808B2

(12) United States Patent
Choi et al.

(10) Patent No.: US 12,652,808 B2
(45) Date of Patent: Jun. 9, 2026

(54) MEMORY PACKAGE AND MEMORY MODULE INCLUDING THE MEMORY PACKAGE

(71) Applicant: SK hynix Inc., Gyeonggi-do (KR)

(72) Inventors: Won Ha Choi, Gyeonggi-do (KR); Han Suk Ko, Gyeonggi-do (KR); Uksong Kang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 292 days.

(21) Appl. No.: 18/108,657

(22) Filed: Feb. 13, 2023

(65) Prior Publication Data

US 2024/0099028 A1     Mar. 21, 2024

(30) Foreign Application Priority Data

Sep. 19, 2022     (KR) ......................... 10-2022-0117774

(51) Int. Cl.
| | |
|---|---|
| *H10B 80/00* | (2026.01) |
| *G11C 5/06* | (2006.01) |
| *H10W 20/20* | (2026.01) |
| *H10W 72/00* | (2026.01) |
| *H10W 90/00* | (2026.01) |

(52) U.S. Cl.
CPC .............. *H10B 80/00* (2023.02); *G11C 5/06* (2013.01); *H10W 20/20* (2026.01); *H10W 72/879* (2026.01); *H10W 90/722* (2026.01); *H10W 90/724* (2026.01); *H10W 90/754* (2026.01)

(58) Field of Classification Search
CPC .. H10B 80/00; G11C 5/06; G11C 5/04; G11C 7/1057; G11C 7/1048; G11C 7/1084; H01L 23/481; H01L 24/16; H01L 24/48; H01L 24/73; H01L 2224/16145; H01L 2224/16225; H01L 2224/48225; H01L 2224/73257; H01L 25/0655; H01L 24/47; H01L 25/0657; H01L 25/18; H01L 2225/06513; H01L 2225/06541
USPC .......................................................... 332/150
See application file for complete search history.

(56) References Cited

U.S. PATENT DOCUMENTS

| | | | | |
|---|---|---|---|---|
| 2008/0080261 A1* | 4/2008 | Shaeffer | ................ | H01L 25/105 |
| | | | | 365/189.05 |
| 2019/0044766 A1* | 2/2019 | Lin | ........................ | G11C 7/1096 |
| 2020/0272564 A1* | 8/2020 | Keeth | .................. | G11C 7/1012 |
| 2021/0166995 A1 | 6/2021 | Delacruz | | |
| 2022/0050621 A1* | 2/2022 | Park | .................... | G06F 13/4234 |
| 2022/0076715 A1 | 3/2022 | Lee et al. | | |
| 2022/0076716 A1* | 3/2022 | Um | ........................ | G11C 7/1057 |
| 2022/0238146 A1* | 7/2022 | Woo | .................... | G11C 7/1006 |

* cited by examiner

*Primary Examiner* — Richard Tan
(74) *Attorney, Agent, or Firm* — IP & T GROUP LLP

(57) ABSTRACT

A single memory package includes: a substrate; and a memory chip and a buffer chip that are integrated over the substrate, wherein the memory chip includes an interface modulator embedded therein, and the interface modulator is a serializing modulator including a multi-level amplitude modulator.

16 Claims, 14 Drawing Sheets

65a

65b

63

<u>32C</u>

<u>32D</u>

32E

32F

<u>32G</u>

<u>32H</u>

32I

MEMORY PACKAGE AND MEMORY MODULE INCLUDING THE MEMORY PACKAGE

CROSS-REFERENCE TO RELATED APPLICATIONS

The present application claims priority of Korean Patent Application No. 10-2022-0117774, filed on Sep. 19, 2022, which is incorporated herein by reference in its entirety.

BACKGROUND

1. Field

Embodiments of the present invention disclosure relate generally to a memory package and a memory module including the memory package.

2. Description of the Related Art

Researchers are studying to develop next-generation memory technologies for increasing the data storage capacity of memory devices and speeding up data transfer rates.

SUMMARY

Various embodiments of the present invention disclosure are directed to a memory package including a serializing modulator, and a memory module including the memory package.

Various embodiments of the present invention disclosure are directed to a memory package including an interface modulator capable of increasing data density, and a memory module including the memory package.

Various embodiments of the present invention disclosure are directed to a memory package including a multi-level modulator, and a memory module including the memory package.

In accordance with an embodiment of the present invention disclosure, a single memory package is provided that includes: a substrate; and a memory chip and a buffer chip that are integrated over the substrate. The memory chip includes an interface modulator embedded therein, and the interface modulator is a serializing modulator including a multi-level amplitude modulator.

In accordance with another embodiment of the present invention disclosure, a single memory package includes: a memory region; an interface region; and a buffer region. The interface region includes a multi-level amplitude modulator, and the interface region is embedded in the buffer region.

In accordance with another embodiment of the present invention disclosure, a memory module includes: a module substrate; and a driving chip and a plurality of memory packages mounted on the module substrate. Each of the memory packages includes: a substrate; and a memory chip, an interface modulator, and a buffer chip all being mounted on the substrate. The interface modulator is a serializing modulator including a multi-level amplitude modulator.

DETAILED DESCRIPTION

Figure 1A:
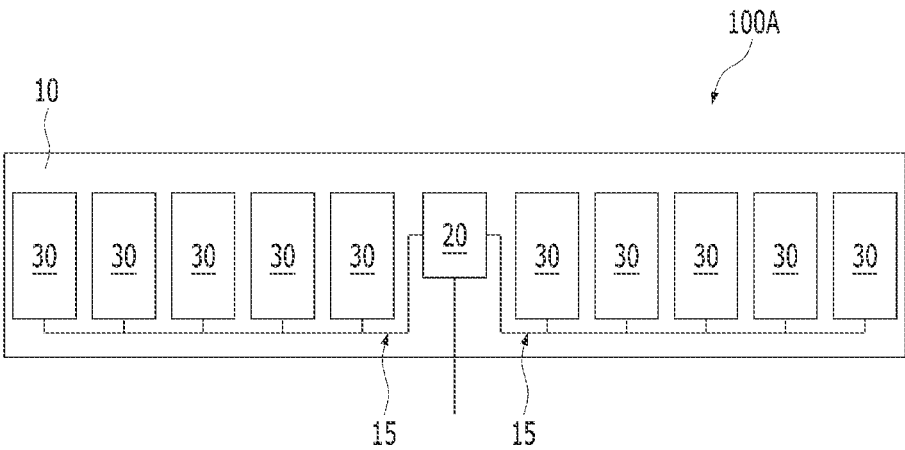
FIGS. 1A and 1B are block diagrams schematically illustrating memory modules in accordance with embodiments of the present invention disclosure.
Figure 1B:
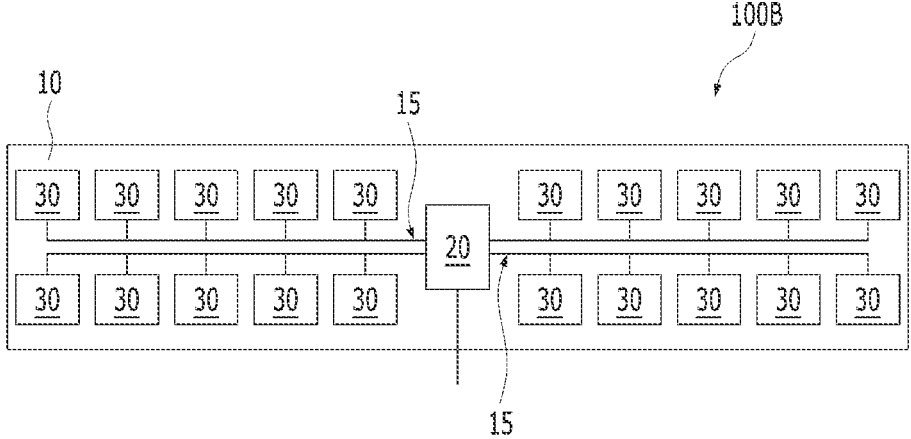

FIGS. 1A and 1B are block diagrams schematically illustrating memory modules 100A and 100B in accordance with embodiments of the present invention disclosure. Referring to FIGS. 1A and 1B, the memory modules 100A and 100B according to the embodiments of the present invention disclosure may include a driving chip 20 and a plurality of memory packages 30 all being mounted on a module substrate 10, respectively. The memory modules 100A and 100B may be one of a Dual In-line Memory Module (DIMM), an Un-buffered DIMM (UDIMM), a Registered DIMM (RDIMM), a Load Reduced Dual In-line Memory Module (LRDIMM), or a Multiplexer Combined Rank DIMM (MCR DIMM). The module substrate 10 may include a printed circuit board (PCB). The driving chip 20 may be a Register Clock Driver (RCD). The memory packages 30 may include one DRAM chip or a plurality of DRAM chips. The driving chip 20 may communicate with the memory packages 30 through module channel buses 15.

Figure 2A:
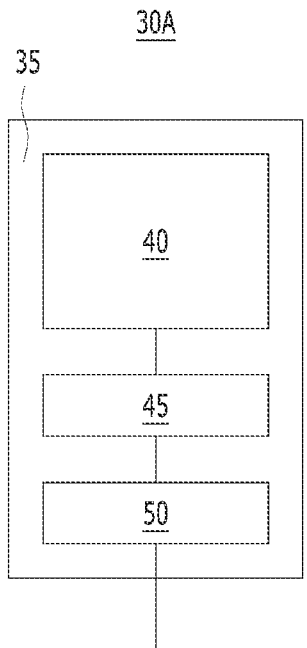
FIGS. 2A to 2H are block diagrams schematically illustrating memory packages in accordance with embodiments of the present invention disclosure.

FIGS. 2A to 2H are block diagrams schematically illustrating memory packages 30A to 30H in accordance with embodiments of the present invention disclosure. Referring to FIG. 2A, a memory package 30A according to an embodiment of the present invention disclosure may include a memory chip 40, an interface modulator 45, and a buffer chip 50 all being mounted on a substrate 35. The substrate 35 may include a printed circuit board (PCB) or a redistribution layer. The redistribution layer may include a silicon layer. The memory chip 40 may include a memory device such as Dynamic Random Access Memory (DRAM). The interface modulator 45 may include a serializing modulator. For example, the interface modulator 45 may include a multi-level modulator, such as a 4-Level Pulse Amplitude Modulator (PAM4). The buffer chip 50 may include a buffering circuit, such as a latch circuit. In one embodiment of the present invention disclosure, the memory chip 40, the interface modulator 45, and the buffer chip 50 may be unit packages individually packaged. According to an embodiment of the present invention disclosure, at least one of the memory chip 40, the interface modulator 45, and the buffer chip 50 may be provided as a chiplet. In an embodiment, a chiplet may be a tiny integrated circuit that contains a specified functionality and may be designed to be combined with other chiplets in a single package. For example, at least one of the memory chip 40, the interface modulator 45, and the buffer chip 50 may be a wafer-level chip. In one embodiment of the present invention disclosure, the memory chip 40, the interface modulator 45, and the buffer chip 50 may be integrated into one memory package 30A.

Figure 2B:
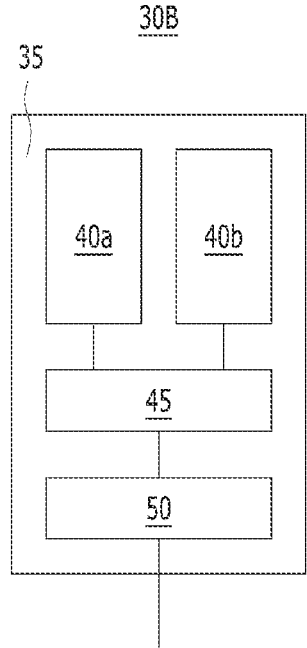

Referring to FIG. 2B, a memory package 30B according to an embodiment of the present invention disclosure may include at least two (e.g., first and second) memory chips 40a and 40b, an interface modulator 45, and a buffer chip 50 all being mounted on a substrate 35. The first and second memory chips 40a and 40b may be commonly coupled to the interface modulator 45. In other words, the first and second memory chips 40a and 40b may share the interface modulator 45.

Figure 2C:
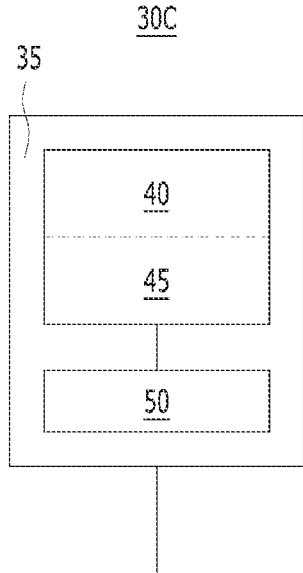

Referring to FIG. 2C, a memory package 30C according to an embodiment of the present invention disclosure may include a memory chip 40, an interface modulator 45, and a buffer chip 50 all being mounted on a substrate 35. The memory chip 40 and the interface modulator 45 may be integrated into one chip or one package. For example, the interface modulator 45 may be embedded in the memory chip 40. In another embodiment of the present invention disclosure, the memory chip 40 may be embedded in the interface modulator 45.

Figure 2D:
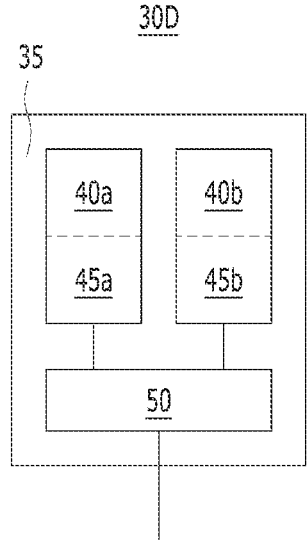

Referring to FIG. 2D, a memory package 30D according to an embodiment of the present invention disclosure may include at least two (first and second) memory chips 40a and 40b, at least two (e.g., first and second) interface modulators 45a and 45b, and a buffer chip 50 all being mounted on a substrate 35. Each of the first and second memory chips 40a and 40b and each of the first and second interface modulators 45a and 45b may be integrated into one chip or one package, respectively. For example, the first and second interface modulators 45a and 45b may be respectively embedded in the first and second memory chips 40a and 40b. In one embodiment of the present invention disclosure, the first and second memory chips 40a and 40b may be respectively embedded in the first and second interface modulators 45a and 45b, respectively. The first and second memory chips 40a and 40b and the corresponding first and second interface modulators 45a and 45b may share the common buffer chip 50.

Figure 2E:
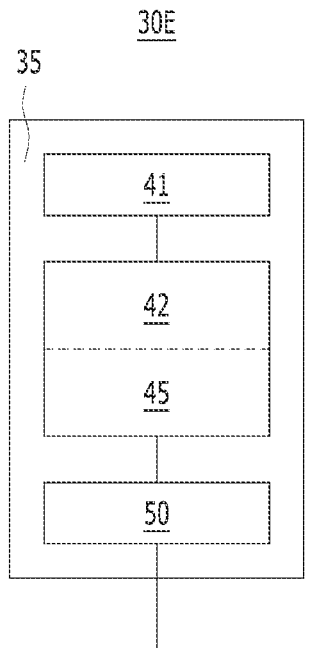

Referring to FIG. 2E, a memory package 30E according to an embodiment of the present invention disclosure, may include a memory core chip 41, a memory logic chip 42, an interface modulator 45, and a buffer chip 50 all being mounted on a substrate 35. At least one of the memory core chip 41, the memory logic chip 42, the interface modulator 45, and the buffer chip 50 may be provided as a chiplet. The memory logic chip 42 and the interface modulator 45 may be integrated in one chip or one package. The memory core chip 41 may include a cell region (a core region) of a memory semiconductor device. The memory logic chip 42 may include a peripheral region (a logic region) of the memory semiconductor device. In other words, the memory core chip 41 and the memory logic chip 42 may be integrated in one memory device.

Figure 2F:
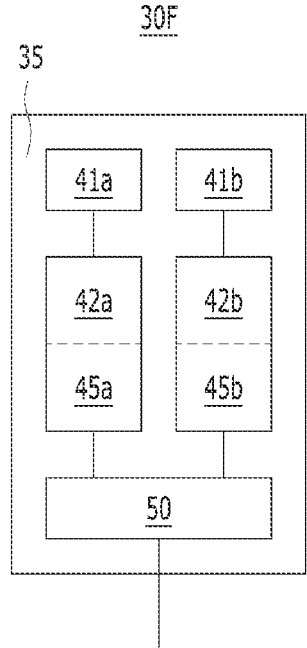

Referring to FIG. 2F, a memory package 30F according to an embodiment of the present invention disclosure may include at least two (e.g., first and second) memory core chips 41a and 41b, at least two (e.g., first and second) memory logic chips 42a and 42b, at least two (e.g., first and second) interface modulators 45a and 45b, and a buffer chip 50 all being mounted on a substrate 35. At least one of the first and second memory core chips 41a and 41b, the first and second memory logic chips 42a and 42b, the first and second interface modulators 45a and 45b, and the buffer chips 50 may be provided as chiplet. Each of the first and second memory logic chips 42a and 42b and each of the first and second interface modulators 45a and 45b may be integrated in one chip or one package, respectively.

Figure 2G:
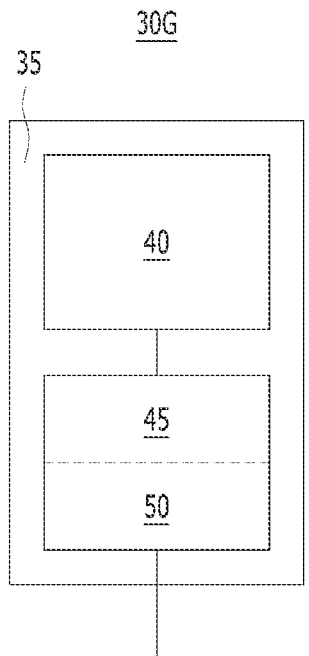

Referring to FIG. 2G, a memory package 30G according to an embodiment of the present invention disclosure may include a memory chip 40, an interface modulator 45, and a buffer chip 50 all being mounted on a substrate 35. The interface modulator 45 and the buffer chip 50 may be integrated into one chip or one package. For example, the interface modulator 45 may be embedded in the buffer chip 50. At least one of the memory chip 40, the interface modulator 45, and the buffer chip 50 may be provided as chiplet.

Figure 2H:
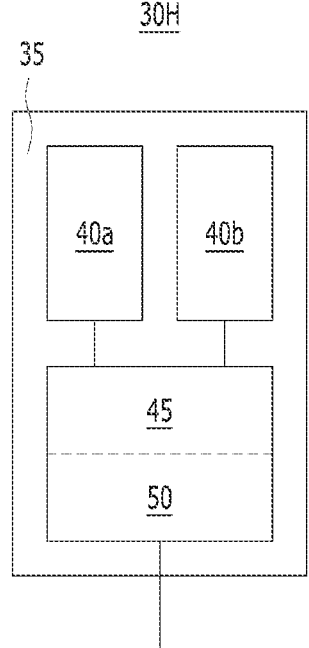

Referring to FIG. 2H, a memory package 30H according to an embodiment of the present invention disclosure may include at least two (e.g., first and second) memory chips 40a and 40b, an interface modulator 45, and a buffer chip 50 all being mounted on a substrate 35. The interface modulator 45 and the buffer chip 50 may be integrated into one chip or one package. At least one of the first and second memory chips 40a and 40b, the interface modulator 45, and the buffer chip 50 may be provided as chiplet.

The memory packages 30A to 30H illustrated in FIGS. 2A to 2H may have a PIP (package(s) in a package) structure in which a plurality of packages are integrated in one package, or a CIP (chips in a package) structure in which a plurality of wafer-level chiplets are integrated in one package.

Figure 3A:
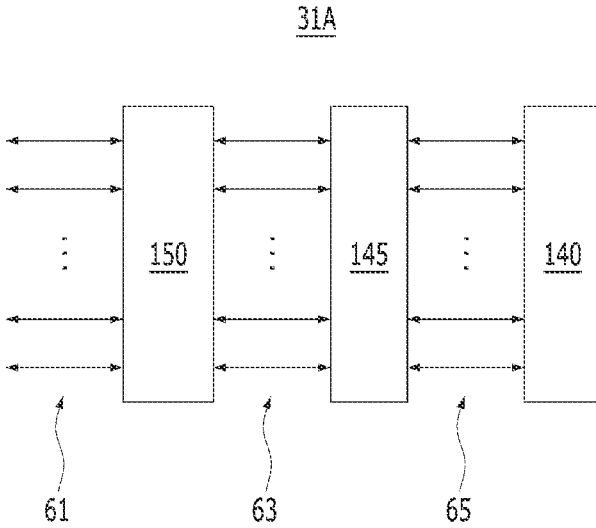
FIGS. 3A to 3F are block diagrams illustrating operations of memory packages in accordance with embodiments of the present invention disclosure.

FIGS. 3A to 3F are block diagrams illustrating operations of memory packages 31A to 31D in accordance with embodiments of the present invention disclosure. Referring to FIG. 3A, a memory package 31A according to an embodiment of the present invention disclosure may include a memory region 140, an interface region 145, a buffer region 150, a plurality of external data channel buses 61, a plurality of buffer data channel buses 63, and a plurality of interface data channel buses 65. The buffer region 150 may communicate with an external system through the external data channel buses 61. The buffer region 150 and the interface region 145 may communicate with each other through the buffer data channel buses 63. The interface region 145 and the memory region 140 may communicate with each other through the interface data channel buses 65. The memory region 140 may include a memory chip 40. The interface region 145 may include an interface modulator 45. The buffer region 150 may include a latch circuit. The interface region 145 may perform a multi-level signaling operation. For example, in an output mode, the interface region 145 may modulate two-level signals (0 and 1) provided from the memory region 140 into four-level signals (00, 01, 10, and 11) and provide the modulated four-level signals to the buffer region 150. Alternatively, in an input mode, the interface region 145 may demodulate the four-level signals (00, 01, 10, and 11) provided from the buffer region 150 into two-level signals (0 and 1) and provide the demodulated two-level signals to the memory region 140. For example, the interface region 145 may multiply (e.g., double) the data density of data provided from the memory region 140 and provide the multiplied data (e.g., doubled data) to the buffer region 150. Thus, the data transfer rate may be doubled. According to an embodiment of the present invention disclosure, referring to FIG. 2A, the memory region 140 may correspond to the memory chip 40, and the interface region 145 may correspond to the interface modulator 45. The buffer region 150 may correspond to the buffer chip 50. According to an embodiment of the present invention disclosure, referring to FIG. 2C, the memory region 140 and the interface region 145 may be integrated into one chip or one package. For example, the memory region 140 and the interface region 145 may be integrated into one chip or package. In one embodiment, the memory region 140 and the interface region 145 may be chiplets all being mounted on the same substrate 35. According to an embodiment of the present invention disclosure, referring to FIG. 2G, the interface region 145 and the buffer region 150 may be integrated into one chip or one package. For example, the interface region 145 and the buffer region 150 may be integrated into one chip or one package. In one embodiment, the interface region 145 and the buffer region 150 may be chiplets all being mounted on the same substrate.

Figure 3B:
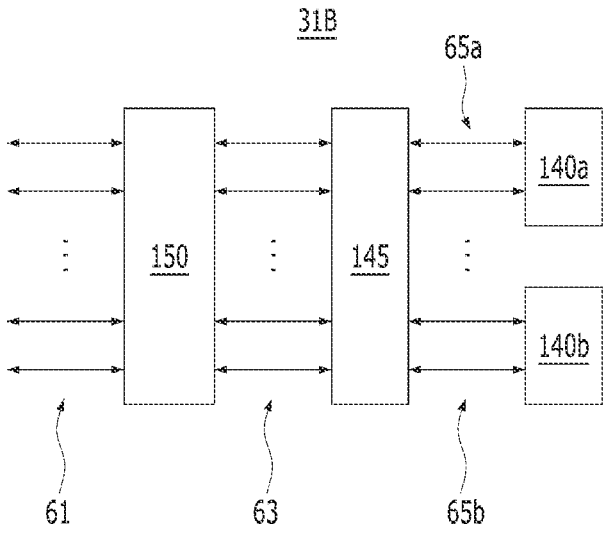

Referring to FIG. 3B, a memory package 31B according to an embodiment of the present invention disclosure may include at least two (e.g., first and second) memory regions 140a and 140b, an interface region 145, a buffer region 150, a plurality of external data channel buses 61, a plurality of buffer data channel buses 63, and a plurality of first and second interface data channel buses 65a and 65b. The interface region 145 and the first and second memory regions 140a and 140b may communicate with each other through the first and second interface data channel buses 65a and 65b, respectively. According to an embodiment of the present invention disclosure, the first and second memory regions 140a and 140b may correspond to the first and second memory chips 40a and 40b of FIG. 2B, respectively, and the interface region 145 may correspond to the interface modulator of FIG. 2B, and the buffer region 150 may correspond to the buffer chip 50 of FIG. 2B. According to an embodiment of the present invention disclosure, referring to FIG. 2H, the interface region 145 and the buffer region 150 may be integrated into one chip or one package. For example, the interface region 145 and the buffer region 150 may be integrated into one chip or one package. In one embodiment, the interface region 145 and the buffer region 150 may be chiplets all being mounted on the same substrate 35.

Figure 3C:
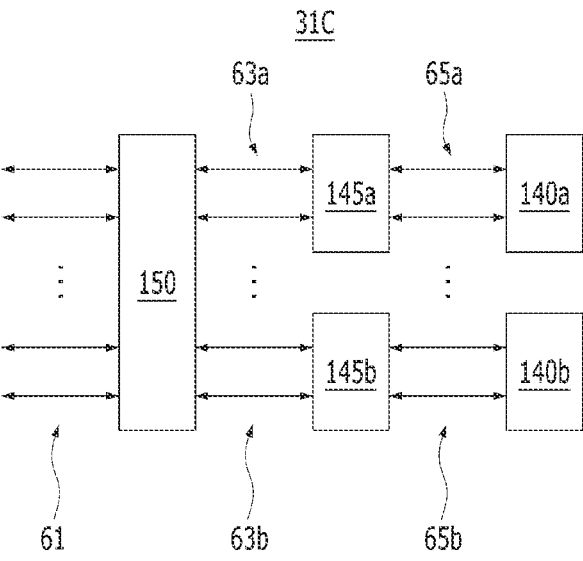

Referring to FIG. 3C, a memory package 31C according to an embodiment of the present invention disclosure may include at least two (e.g., first and second) memory regions 140a and 140b, at least two (e.g., first and second) interface regions 145a and 145b, a buffer region 150, a plurality of external data channel buses 61, a plurality of first and second buffer data channel buses 63a and 63b, and a plurality of first and second interface data channel buses 65a and 65b. The first and second memory regions 140a and 140b may correspond to the first and second interface regions 145a and 145b, respectively. In one embodiment, referring to FIG. 2D, each of the memory regions 140a and 140b and each of the corresponding interface regions 145a and 145b may be integrated. For example, the first memory region 140a and the first interface region 145a may be integrated into one chip or one package, and the second memory region 140b and the second interface region 145b may be integrated into one chip or one package. In one embodiment, the first memory region 140a and the first interface region 145a, and the second memory region 140b and the second interface region 145b may be chiplets mounted on the same substrate 35, respectively.

Figure 3D:
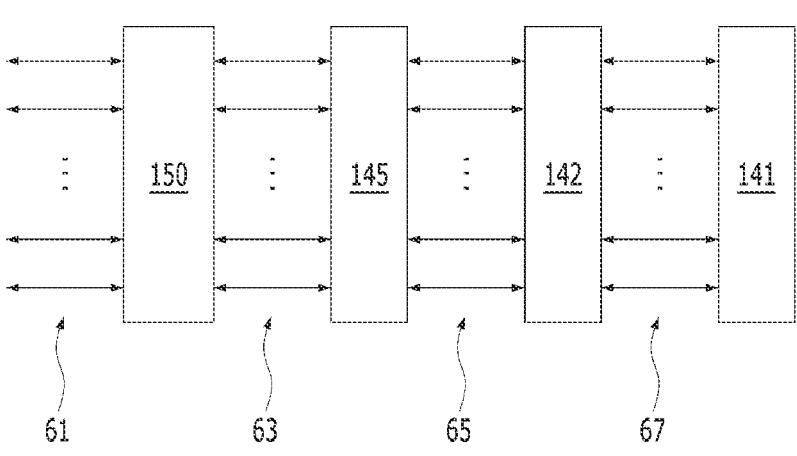

Referring to FIG. 3D, a memory package 31D according to an embodiment of the present invention disclosure may include a memory core region 141, a memory logic region 142, an interface region 145, a buffer region 150, a plurality of external data channel buses 61, a plurality of buffer data channel buses 63, a plurality of interface data channel buses 65, and a plurality of memory data channel buses 67. The memory core region 141 and the memory logic region 142 may communicate with each other through the memory data channel buses 67. For example, the memory region 140 of FIG. 3A may be divided into the memory core region 141 and the memory logic region 142. According to an embodiment of the present invention disclosure, referring to FIG. 2E, the memory logic region 142 and the interface region 145 may be integrated into one chip or one package. For example, the memory logic region 142 and the interface region 145 may be integrated into one chip or one package. Alternatively, the memory logic region 142 and the interface region 145 may be chiplets all being mounted on the same substrate 35.

Figure 3E:
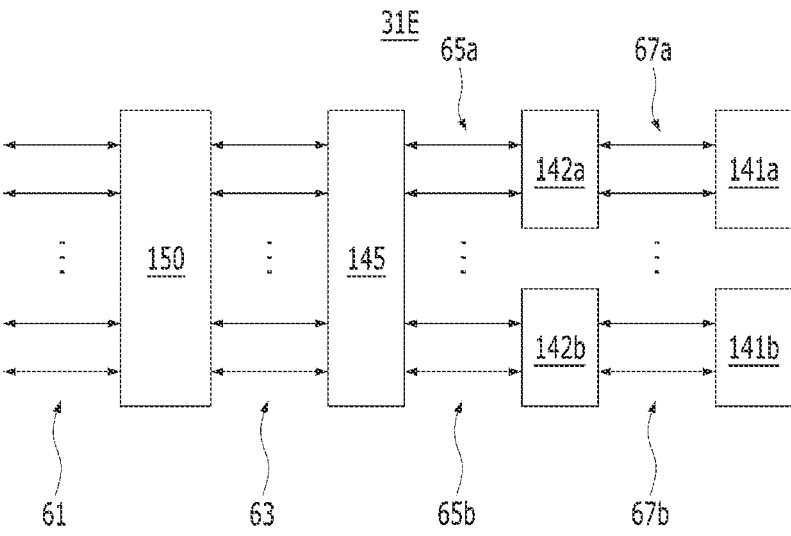

Referring to FIG. 3E, a memory package 31E according to an embodiment of the present invention disclosure may include at least two (e.g., first and second) memory core regions 141a and 141b, at least two (e.g., first and second) memory logic regions 142a and 142b, an interface region 145, a buffer region 150, a plurality of external data channel buses 61, a plurality of buffer data channel buses 63, a plurality of interface data channel buses 65a and 65b, and a plurality of memory data channel buses 67a and 67b.

Figure 3F:
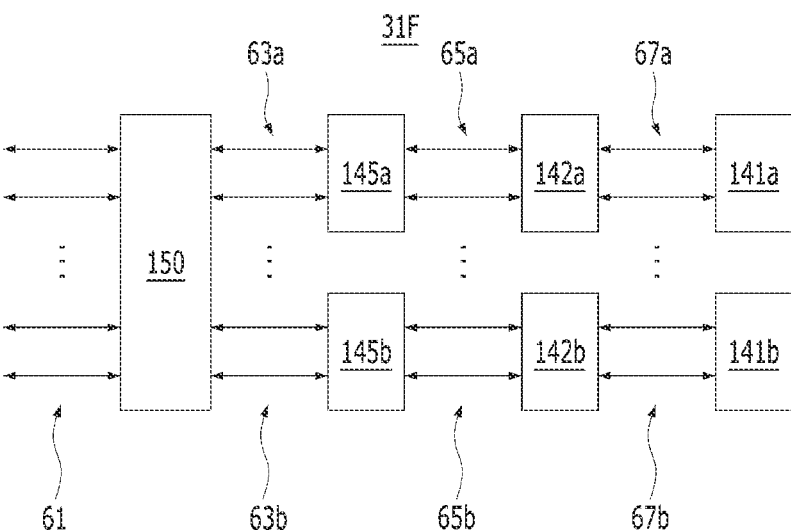

Referring to FIG. 3F, a memory package 31F according to an embodiment of the present invention disclosure may include at least two (e.g., first and second) memory core regions 141a and 141b, at least two (e.g., first and second) memory logic regions 142a and 142b, at least two (e.g., first and second) interface regions 145a and 145b, a buffer region 150, a plurality of external data channel buses 61, a plurality of first and second buffer data channel buses 63a and 63b, a plurality of first and second interface data channel buses 65a and 65b, and a plurality of first and second memory data channel buses 67a and 67b. According to an embodiment of the present invention disclosure, referring to FIG. 2F, the first and second interface regions 145a and 145b may correspond to the first and second interface modulators 45a and 45b of FIG. 2F, and the first and second memory logic regions 142a and 142b and the corresponding first and second interface regions 145a and 145b may be integrated into one chip or one package, respectively. For example, the first and second memory logic regions 142a and 142b and the corresponding first and second interface regions 145a and 145b may be integrated into one chip or one package. In one embodiment, the first and second memory logic regions 142a and 142b and the corresponding first and second interface regions 145a and 145b may be chiplets all being mounted on the same substrate 35.

Figures 4A, 4B:
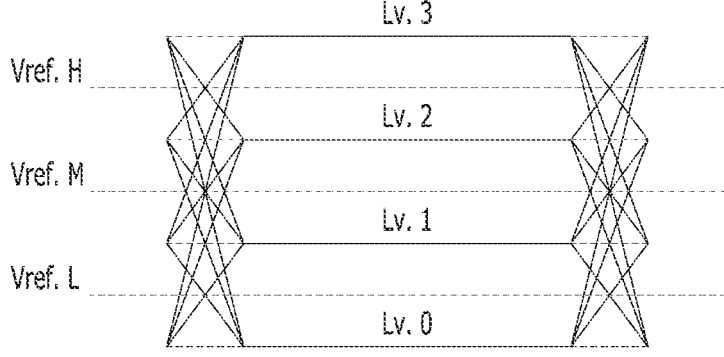
FIGS. 4A and 4B are timing diagrams schematically illustrating an operation of an interface modulator in accordance with an embodiment of the present invention disclosure.

FIGS. 4A and 4B are timing diagrams schematically illustrating an operation of the interface modulator 45 in accordance with an embodiment of the present invention disclosure. Referring to FIGS. 3A to 3D, and 4A and 4B, data on the first interface data channel bus 65a and data on the second interface data channel bus 65b may be modulated by one buffer data channel bus 63. Each of the first interface data channel bus 65a and the second interface data channel bus 65b may transfer data of 1 bit. For example, the first and second interface data channel buses 65a and 65b may have two levels of signal levels. Specifically, the first and second interface data channel buses 65a and 65b may transfer data of 0 and 1 in a first level (i.e., low level, Lv. L) and a second level (i.e., high level, Lv. H). The first interface data channel bus 65a and the second interface data channel bus 65b may correspond to the interface data channel bus 65 in FIGS. 3A to 3D. The buffer data channel bus 63 may transfer data in two bits. For example, the buffer data channel bus 63 may have four levels of signal levels. Specifically, the buffer data channel bus 63 may transfer a first level (i.e., bottom or lowest level, Lv. 0, 00), a second level (i.e., lower level, Lv. 1, 01), a third level (i.e., high level, Lv. 2, 10), and a fourth level (i.e., top or highest level, Lv. 3, 11).

The interface modulator 45 may transfer data by modulating the data in two bits according to a combination of the data of the first interface data channel bus 65a and the data of the second interface data channel bus 65*b*. For example, the interface modulator 45 may modulate the data as follows.

| | Data on the first Interface data channel 65a | Data on the second Interface data channel 65b | Modulated data on the buffer data channel 63 |
|---|---|---|---|
| Data levels | Low (0) | Low (0) | Lv. 0 (00) |
| | Low (0) | High (1) | Lv. 1 (01) |
| | High (1) | Low (0) | Lv. 2 (10) |
| | High (1) | High (1) | Lv. 3 (11) |

For example, two data of two levels may be modulated into one data of four levels. The modulated data may be sensed and determined based on reference voltages Vref. H, Vref. M, and Vref. L having different levels, and the modulated data may be demodulated into two data of two levels. Accordingly, since the data density is doubled, the data transfer rate may be doubled.

According to another embodiment of the present invention disclosure, the interface modulator 45 may modulate the data in 3 bits, i.e., $2^3$, thus, increasing the data density and the data transfer rate four times.

Figure 5A:
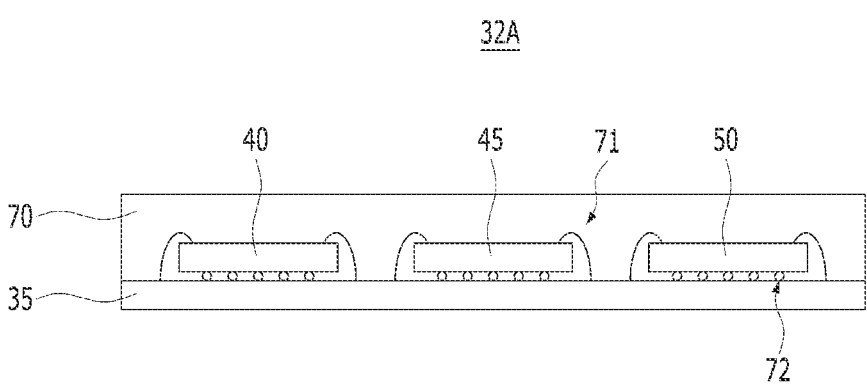
FIGS. 5A to 5I are block diagrams schematically illustrating memory packages in accordance with embodiments of the present invention disclosure.

FIGS. 5A to 5I are block diagrams schematically illustrating memory packages 32A to 32I in accordance with embodiments of the present invention disclosure. Referring to FIG. 5A, a memory package 32A according to an embodiment of the present invention disclosure may include a memory chip 40, an interface modulator 45, and a buffer chip 50 all being mounted on a substrate 35. The substrate 35 may include a printed circuit board and the memory chip 40, the interface modulator 45, and the buffer chip 50 may be electrically connected to the substrate 35 using bonding wires 71. The substrate 35 may be a redistribution layer and the memory chip 40, the interface modulator 45, and the buffer chip 50 may be electrically connected to the substrate 35 by using bumps 72. The memory chip 40, the interface modulator 45, and the buffer chip 50 may be electrically connected to the substrate 35 by using a combination of the bonding wires 71 and the bumps 72. The bumps 72 may include, for example, solder balls, metal pads and the like. The memory package 32A may further include an encapsulant 70 covering the memory chip 40, the interface modulator 45, and the buffer chip 50. The encapsulant 70 may include, for example, an epoxy molding compound (EMC) or polyimide.

Figure 5B:
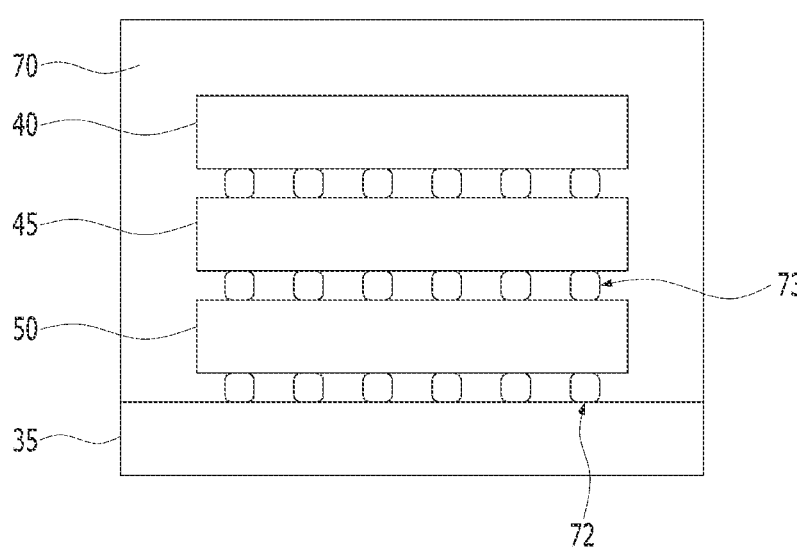

Referring to FIG. 5B, a memory package 32B according to an embodiment of the present invention disclosure may include memory chip 40, interface modulator 45, and buffer chip 50 stacked on a substrate 35. The memory chip 40, the interface modulator 45, and the buffer chip 50 may be vertically stacked. The memory chip 40, the interface modulator 45, and the buffer chip 50 may be electrically connected to each other through inter-chip bumps 73. The buffer chip 50 may be electrically connected to the substrate 35 through the bumps 72.

Figure 5C:
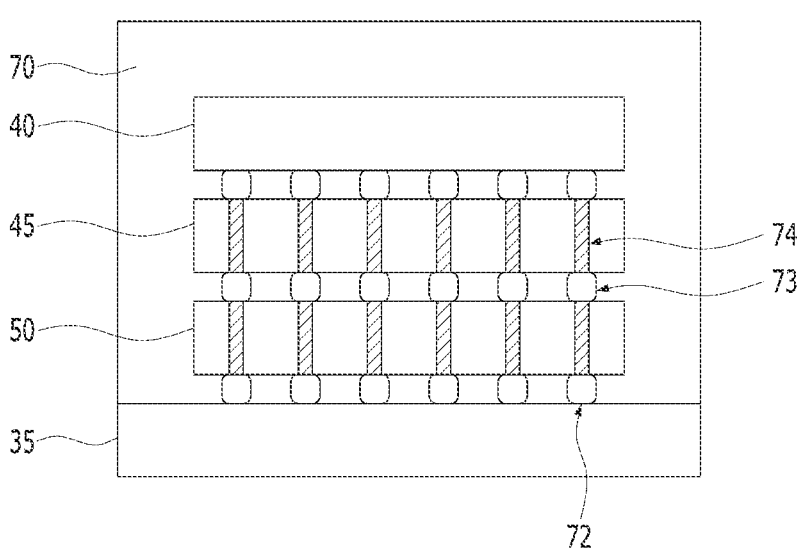

Referring to FIG. 5C, a memory package 32C according to an embodiment of the present invention disclosure may include memory chip 40, interface modulator 45, and buffer chip 50 stacked on substrate 35. The memory chip 40, the interface modulator 45, and the buffer chip 50 may be electrically connected to each other through the inter-chip bumps 73 and through-silicon vias (TSVs) 74. The through-silicon vias 74 may vertically pass through the buffer chip 50. In one embodiment, the through-silicon vias 74 may also vertically pass through the interface modulator 45. The inter-chip bumps 73 may include, for example, metal pads. Accordingly, the memory chip 40, the interface modulator 45, and the buffer chip 50 may be stacked in a hybrid bonding structure. The inter-chip bumps 73 may include, for example, a solder material.

Figure 5D:
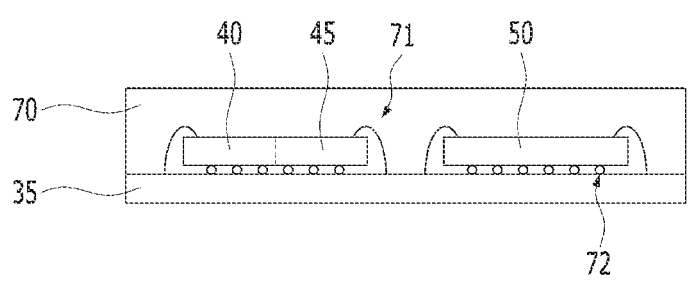
Figure 5E:
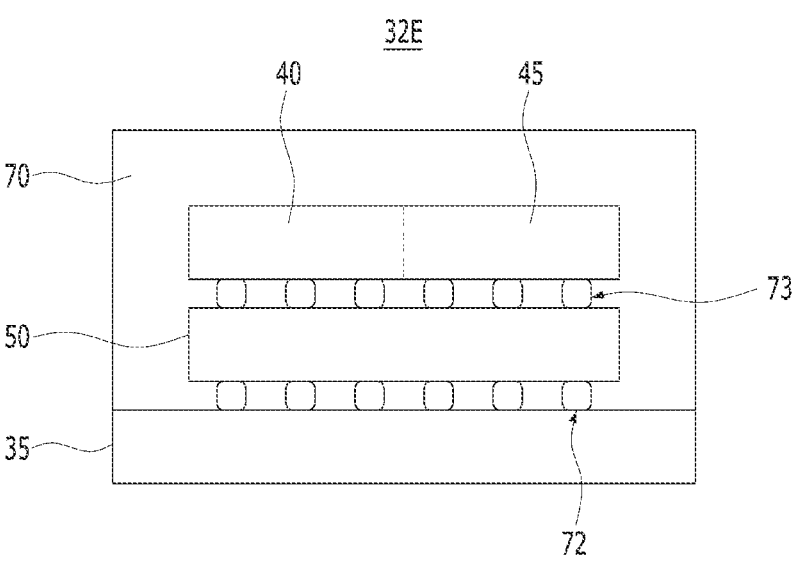
Figure 5F:
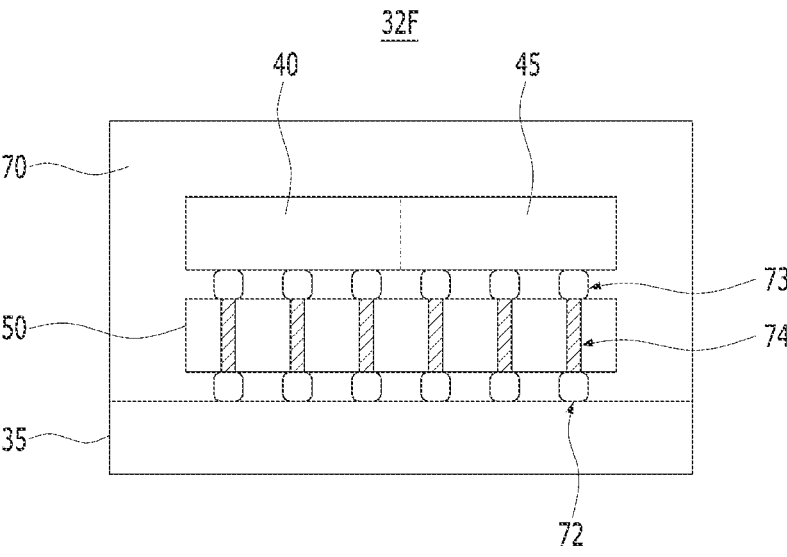

Referring to FIGS. 5D to 5F, memory packages 32D, 32E, and 32F may each include memory chip 40 and buffer chip 50 arranged in a horizontal direction over substrate 35 or each stacked on the substrate 35. The memory chip 40 may include an interface modulator 45. For example, the interface modulator 45 may be embedded in the memory chip 40. For example, the interface modulator 45 may be integrated in a circuit block form and embedded in a peripheral circuit region of the memory chip 40. Inventive concepts of other elements not described may be understood with reference to FIGS. 5A to 5C.

Figure 5G:
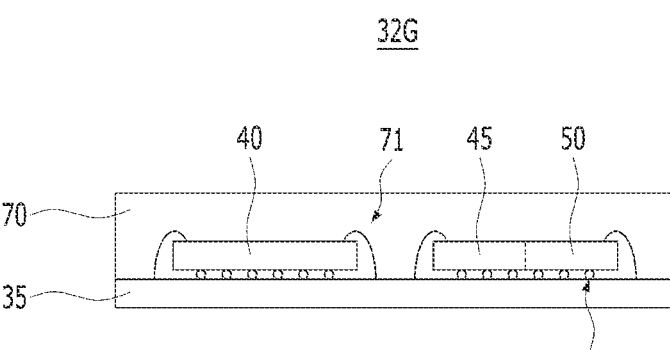
Figure 5H:
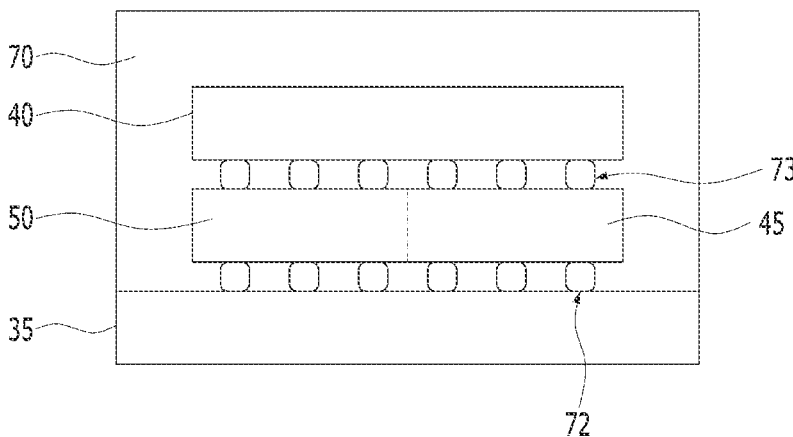
Figure 5I:
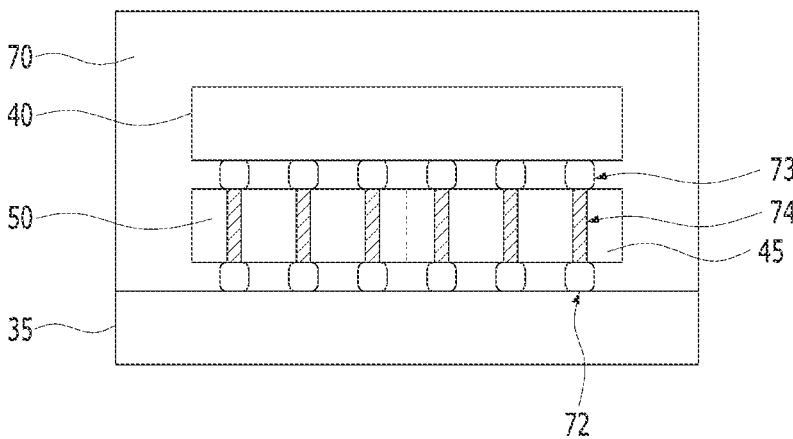

Referring to FIGS. 5G to 5I, the memory packages 32G to 32I may include memory chip 40 and buffer chip 50 that are stacked on substrate 35. The buffer chip 50 may include interface modulator 45. For example, the interface modulator 45 may be embedded in the buffer chip 50. Alternatively, the interface modulator 45 and the buffer chip 50 may be integrated into one chip or one package. Inventive concepts of other elements not described may be understood with reference to FIGS. 5A to 5C.

According to the various embodiments of the present invention disclosure, the data transfer density and the, the data transfer rate can be increased.

While the present invention disclosure has been described with respect to specific embodiments, it will be apparent to those skilled in the art that various changes and modifications may be made without departing from the spirit and scope of the invention as defined in the following claims.

What is claimed is:

1. A single memory package, comprising:
a substrate; and
a memory chip and a buffer chip that are integrated over the substrate,
wherein the memory chip includes an interface modulator embedded therein,
wherein the interface modulator is a serializing modulator including a multi-level amplitude modulator,
wherein the interface modulator includes:
interface data channel buses configured to communicate with the memory chip; and
buffer data channel buses configured to communicate with the buffer chip.

2. The single memory package of claim 1,
wherein the interface data channel buses transfer two levels of signal levels, and
wherein the buffer data channel buses transfer four levels of signal levels.

3. The single memory package of claim 1, wherein the memory chip includes a memory core region including a cell region and a memory logic region including a peripheral circuit region, and
the interface modulator is embedded in the memory logic region.

4. The single memory package of claim 1, wherein at least one of the memory chip, the interface modulator, and the buffer chip is a chiplet.

5. The single memory package of claim 1, wherein the memory chip includes at least two separate memory chips, and
the at least two separate memory chips are commonly coupled to the interface modulator and the buffer chip.

6. The single memory package of claim 1, wherein the memory chip includes at least two separate memory chips, and each of the separate memory chips includes the interface modulator, and
  the interface modulators are commonly coupled to the buffer chip.

7. The single memory package of claim 1, wherein at least one of the memory chip, the interface modulator, and the buffer chip is electrically connected to the substrate through a bonding wire.

8. The single memory package of claim 1, wherein at least one of the memory chip, the interface modulator, and the buffer chip is electrically connected to the substrate through a bump.

9. The single memory package of claim 1, wherein the memory chip and the interface modulator are stacked over the buffer chip, and the buffer chip and the interface modulator are electrically connected to each other through a bump.

10. The single memory package of claim 9, further comprising:

a through-silicon via vertically passing through the buffer chip and electrically connecting the buffer chip to the interface modulator.

11. A memory module, comprising:

a module substrate; and a driving chip and a plurality of memory packages mounted on the module substrate, wherein each of the memory packages includes:

a substrate; and a memory chip, an interface modulator, and a buffer chip all being mounted on the substrate, and wherein the interface modulator is a serializing modulator including a multi-level amplitude modulator, wherein the interface modulator includes:

interface data channel buses configured to communicate with the memory chip; and buffer data channel buses configured to communicate with the buffer chip.

12. The memory module of claim 11, wherein the interface modulator is embedded in the memory chip.

13. The memory module of claim 11, wherein the interface modulator is embedded in the buffer chip.

14. The memory module of claim 11, wherein the interface data channel buses transfer two levels of signal levels; and
  wherein the buffer data channel buses transfer four levels of signal levels.

15. The memory module of claim 11, wherein the memory chip includes at least two separate memory chips, and the at least two memory chips are commonly coupled to the interface modulator.

16. The memory module of claim 11, wherein the memory chip includes at least two or more separate memory chips, and each of the memory chips includes an interface modulator, and the interface modulators are commonly coupled to the buffer chip.

\* \* \* \* \*